United States Patent [19]

Gemma et al.

[11] Patent Number: 4,871,236
[45] Date of Patent: Oct. 3, 1989

[54] ORGANIC THIN FILM DISPLAY ELEMENT

[75] Inventors: Nobuhiro Gemma, Yokohama; Akira Miura, Toride; Koichi Mizushima, Kamakura; Makoto Azuma, Yokohama; Yasushi Mori, Tokyo, all of Japan

[73] Assignee: Kabushiki Kaisha Toshiba, Kawasaki, Japan

[21] Appl. No.: 908,014

[22] Filed: Sep. 16, 1986

[30] Foreign Application Priority Data

Sep. 18, 1985 [JP] Japan .................. 60-205729
Jun. 9, 1986 [JP] Japan .................. 61-133204

[51] Int. Cl.⁴ .......................... G02F 1/01; G02F 1/07; G02F 1/03
[52] U.S. Cl. .................... 350/355; 350/356; 350/357; 350/393
[58] Field of Search ............ 350/355, 356, 357, 393

[56] References Cited

U.S. PATENT DOCUMENTS

| | | | |
|---|---|---|---|
| 3,904,868 | 9/1975 | McEwan et al. | 350/353 |
| 4,013,343 | 3/1977 | Jaccard et al. | 350/357 |
| 4,033,673 | 7/1977 | Seki | 350/356 |
| 4,093,358 | 6/1978 | Shattuck et al. | 350/357 |
| 4,142,783 | 3/1977 | Engler et al. | 350/357 |
| 4,343,537 | 8/1982 | Güntherodt et al. | 350/357 |
| 4,402,573 | 9/1983 | Jones | 350/357 |
| 4,550,982 | 11/1985 | Hirai | 350/357 |
| 4,574,366 | 3/1986 | Potember et al. | 365/153 |
| 4,586,792 | 5/1986 | Yang et al. | 350/357 |
| 4,652,090 | 3/1987 | Uchikawa et al. | 350/357 |
| 4,663,270 | 5/1987 | Potember et al. | 430/495 |
| 4,796,981 | 1/1989 | Nishimura et al. | 350/355 |
| 4,803,011 | 2/1989 | Barraud et al. | 252/518 |

FOREIGN PATENT DOCUMENTS 0165111 12/1985 European Pat. Off. .
60-223887 8/1985 Japan .

OTHER PUBLICATIONS

Proceedings of 2nd Intern. Conf. on Langmuir-Blodgett Films (1985), p. 7-3, A Barraud et al., "Characterization and Properties of Conducting L.B. Films".
Appl. Phys. Lett., 34(6), Mar. 15, 1979, pp. 405-407, R. S. Potember and T. O. Poehler, "Electrical Switching and Memory Phenomena in Cu-TCNQ Thin Films".
Display & Imaging Technology, vol. 1, No. 1, 1985, pp. 61-80, Gordon and Breach Science Publishers, Ltd and OPA Ltd; Y. Hirai et al., "Dynamic Characteristics Analysis for Redox-Pair Electrochromic Display Based on etc.".
Patent Abstracts of Japan, vol. 11, No. 342 (P-365) [2789], 10th Nov. 1987, p. 17 P 635; & JP-A-62 124 534 (Teijin LTD) 05-06-1987.

Primary Examiner—Eugene R. LaRoche
Assistant Examiner—Michael Shingleton
Attorney, Agent, or Firm—Oblon, Spivak, McClelland, Maier & Neustadt

[57] ABSTRACT

An organic thin film display element comprises an organic thin film containing donor moleculaes and acceptor molecules and a pulse voltage source for causing a charge transfer between the donor molecules and the acceptor molecules. The charge transfer varies the optical characteristic of the organic thin film, whereby the organic thin film displays an image.

19 Claims, 9 Drawing Sheets

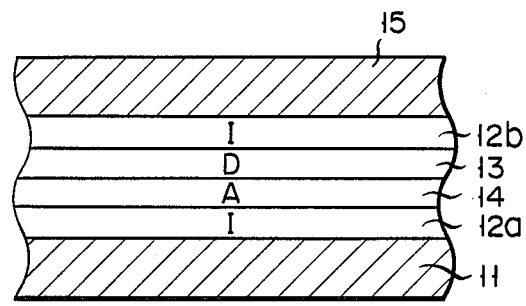
F I G. 1
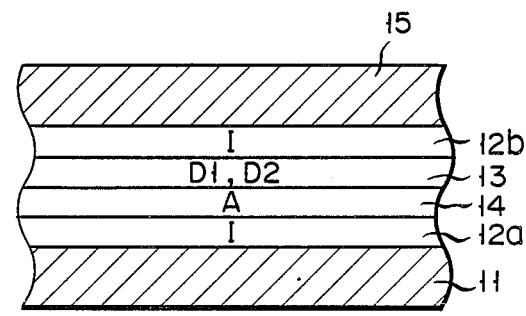
F I G. 2
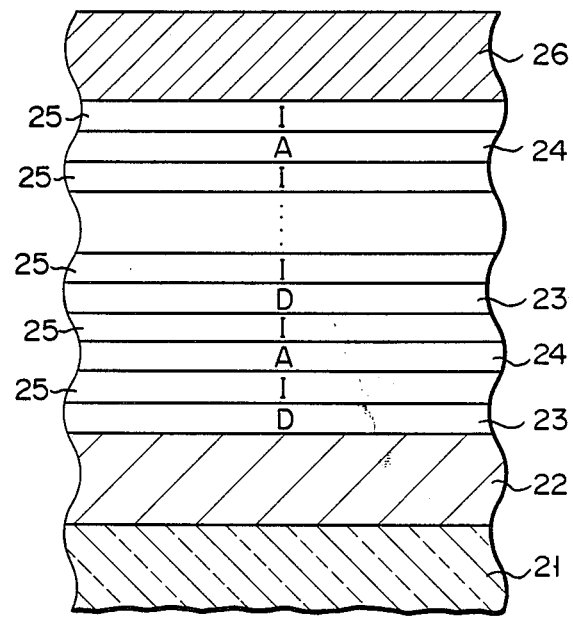
F I G. 3

FIG. 4
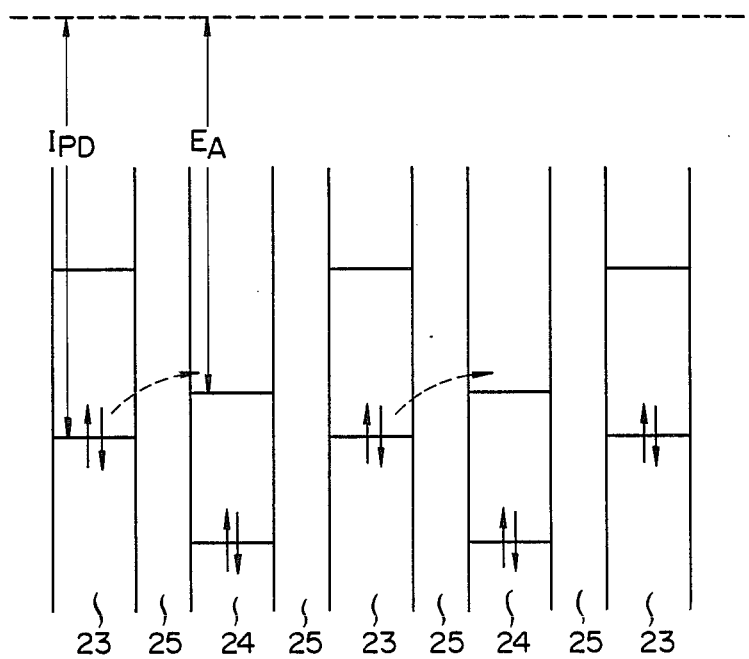
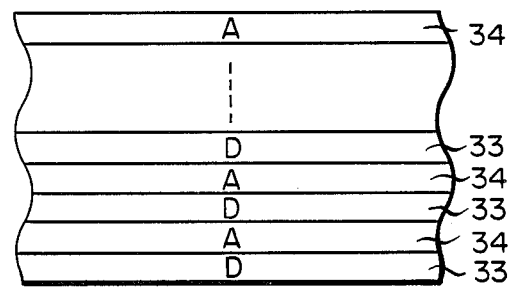
FIG. 5
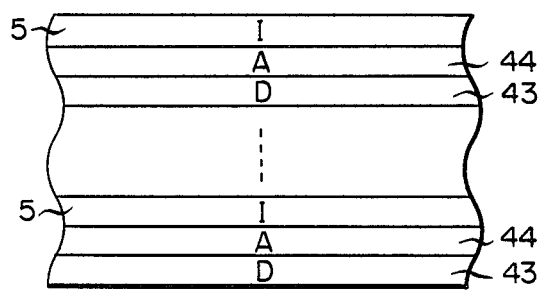
FIG. 6

F I G. 9
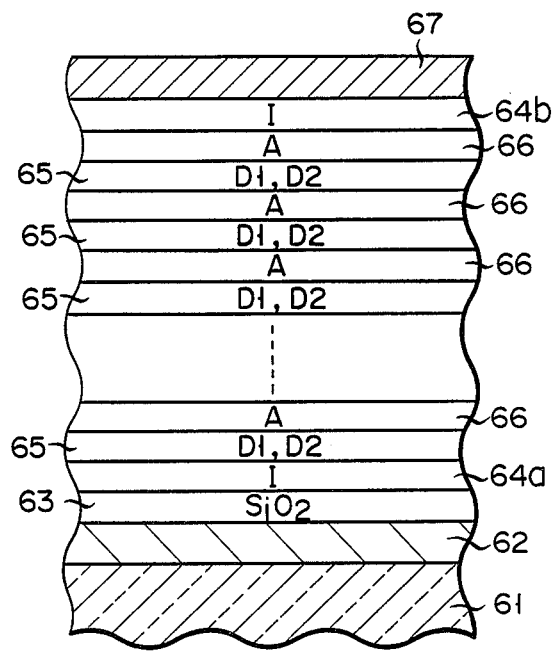
F I G. 10
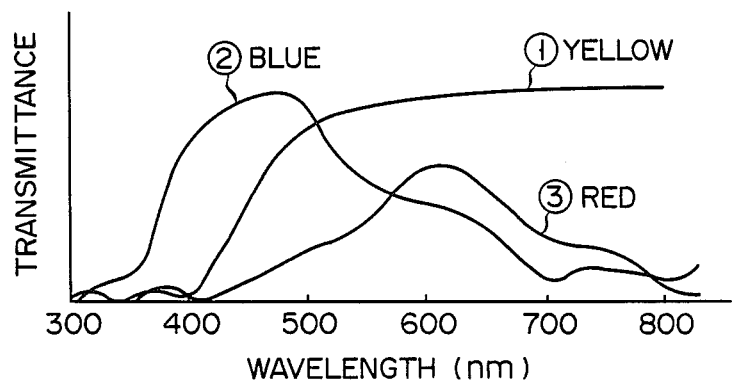

ORGANIC THIN FILM DISPLAY ELEMENT

BACKGROUND OF THE INVENTION

I. Field of the Invention

This invention relates to an organic thin film display element.

II. Description of the Prior Art

In recent years, the development of the technique of forming an extremely thin film of organic material represented by Langmuir-Blodgett process (hereinafter referred to as "LB process") has lead to the active application of said technique to various electronic elements.

Studies in this particular field (represented, for example, by the research work on the MIS type semiconductor element using a thin organic film) are widely pursued. Under the present state, however, no new functional element has been practically proposed which effectively utilizes the properties peculiar to said thin organic film.

Among the properties of the organic material, that which draws the greatest attention from the view point of applying said material to a functional element is a charge transfer phenomenon among the molecules. In this connection it will be noted that some of the organic materials comprise donor molecules which have a low ionization potential and tend to be converted into positive ions by supplying electrons to other molecules. The other organic materials are formed of acceptor molecules which have a high electron affinity and receive electrons from other molecules and tend to be negative ions by themselves. It is well known that these two types of molecules are combined into a compound generally referred to as a charge-transfer complex. For instance a complex of perylene and tetracyanoquinodimethane (TCNQ) is formed of neutral molecules giving rise no charge transfer. In contrast, a complex of tetramethylphenylenediamine (TMPD) and TCNQ represents an ionic compound composed of positive and negative molecules. It is also known that a compound of tetrathiofulvalene (TTE) and TCNQ indicates a transition from a neutral to an ionic state depending on temperature and pressure.

When the charge transfer phenomenon of the above-mentioned organic material is utilized as an operation principle of an element, it is required that the organic material possess of excellent charge transfer properties including quick response and high controllability, and further can be easily prepared. However, the satisfaction of the above-mentioned requirements is accompanied with the drawbacks that the charge-transfer complex crystal presents tremendous difficulties in the growth of a crystal, and it is difficult to externally control the charge transfer. Further, the control of a charge transfer between a metal thin film and organic thin film by means of a light or electric field is applied to a switching element or memory element. However, this attempt is accompanied with great drawbacks in respect of the charge transfer efficiency, the speed of responsibility, the effective life of the processed elements, etc. As mentioned above, the phenomenon of charge transfer in an organic material has not yet been fully put to practical application, though great hope has been pinned on the utilization of the charge transfer phenomenon to the organic element.

Another noticeable property of an organic material in question is its optical characteristic. Like various organic coloring materials, many of the proposed organic materials respond to light falling within the visible range and some are possessed of a high light-absorbing property. To date, an electro-chromic display (ECD) element has been known as a element to which the optical property of the aforementioned organic material has been applied. This ECD element is characterized in that the ionic condition of an organic material is changed by impressing an electric field an organic molecules in a solution, and the display of an image is carried out by changes in the absorption spectrum occurring in the visible range. The ECD element offers the advantages that an image is distinctly displayed and the view field is very much broadened.

Nevertheless, the ECD element is still accompanied with the drawbacks that the behavior of the ECD is followed by the shifting of ions or protons, resulting in an extreme decline in the responding speed and operating efficiency. Moreover, the ECD element presents difficulties in the repeating characteristic and moreover has a short effective life. Consequently, the ECD element is retarded in practical application in spite of its excellent optical properties.

Further, there is a great demand for the development of a new element which is possessed of such a novel function as can not be expected from the conventional electroluminescence device, light-emitting diode (LED), liquid crystal display element, etc. Such a novel function may be represented, for example, by that of a single picture element capable of displaying various tints. A light-emitting display element represented by the conventional LED has the drawback that its light-emitting property is defined by the parameter of the raw material of said element. Tremendous difficulties are encountered in controlling the wavelength of an emitted light by an external factor such as voltage. Moreover, a liquid crystal display element indicates colors by means of filters of red, green and blue colors. Essentially, therefore, one picture element of such an element is capable of displaying only one color.

SUMMARY OF THE INVENTION

It is accordingly the object of the present invention to provide a display element using an organic thin film having excellent properties in respect of response speed, efficiency and effective life.

Another object of the invention is to provide a thin organic film color display device in which a single picture element is capable of displaying a plurality of colors one after another.

To attain the above-mentioned object, this invention provides a display element which comprises:

a thin organic film containing donor molecules and acceptor molecules; and means for effecting charge transfer between said donor molecules and acceptor molecules, and wherein an image is displayed by utilizing those changes in the optical properties of said thin organic film which result from said charge transfer.

Charge transfer between said donor molecules and acceptor molecules may be effected by impressing a voltage on a thin organic film. According to the present invention, a thin organic film may be formed of the type in which a single film contains both donor molecules and acceptor molecules, or the type which is constructed by superposing a first thin film containing donor molecules and a second thin film containing acceptor molecules on each other. Or said thin organic film may be composed by alternately and repeatedly laminating a first thin film containing donor molecules and a second thin film containing acceptor molecules. In these cases, a third thin film containing insulating organic molecules may be interposed between the thin films. Or the thin organic film may consist of pairs of donor molecule film and acceptor molecule film, with the thin film interposed between two of said pairs. Said insulating organic molecules may not only be used to provide said third insulating film, but also be mixed with the donor molecules of the first film, as well as with the acceptor molecules of the second film.

As used herein, the donor molecule is defined to mean the organic molecule which has a small ionization potential ($I_p$) and releases electrons to another molecule and is readily turned into a positive ion. The above-mentioned donor molecules related to the present invention may be listed as below:

(1) Fulvalene type donors having the undermentioned structural formulas:

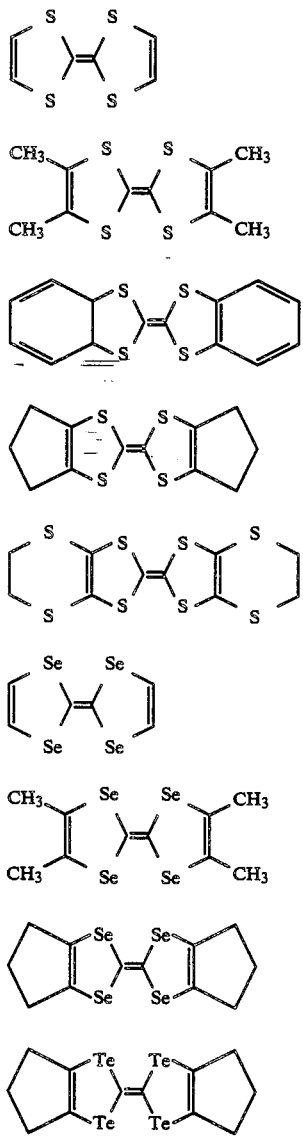

TTF

TMTTF

DBTTF

HMTTF

BEDT—TTF

TSF

TMTSF

HMTSF

HMTTeF (2) S-containing heterocyclic donor having the undermentioned structural formulas:

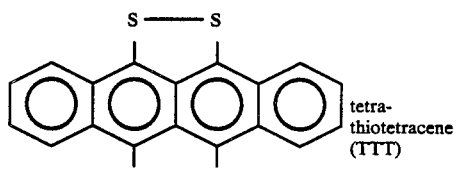

tetra-
thiotetracene
(TTT)

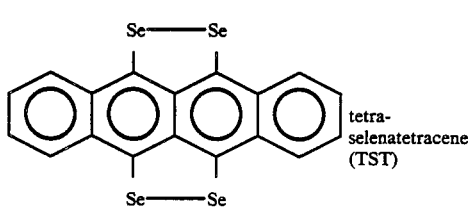

tetra-
selenatetracene
(TST)

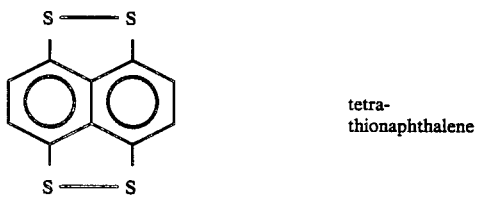

tetra-
thionaphthalene

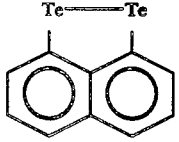

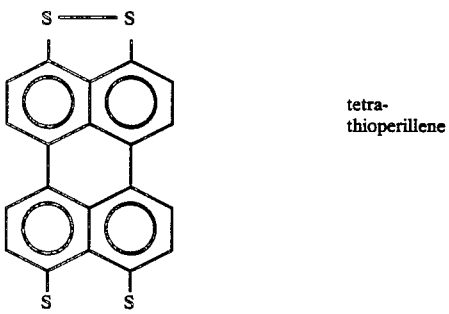

tetra-
thioperillene

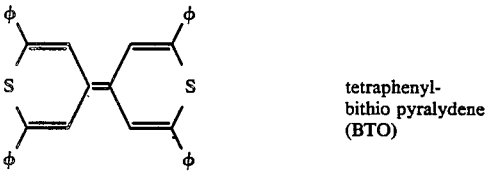

tetraphenyl-
bithio pyralydene
(BTO)

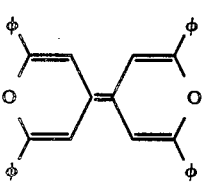

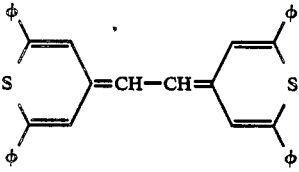

-continued

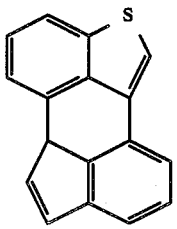
bizenzothiophene (BBT)

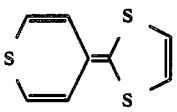

Note:
φ given in the above formulas represents a phenyl radical.

(3) Amine type donor having the undermentioned structural formula:

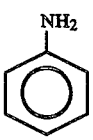 aniline

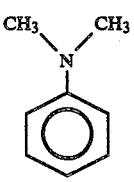 N—methyl aniline

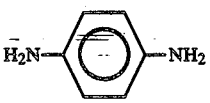 p-phenylenediamine

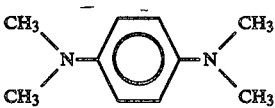 TMPD

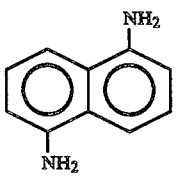 diaminonaphthalene

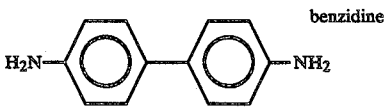 benzidine

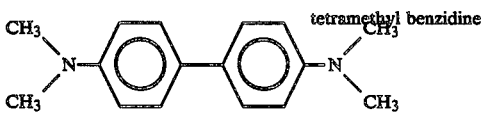 tetramethyl benzidine

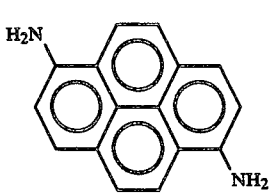 diaminopyrene

-continued

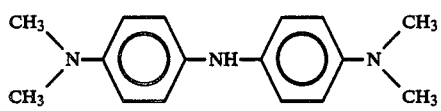

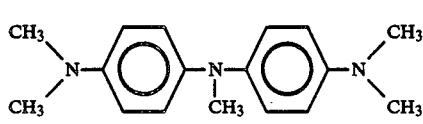

(4) Metal compound type donor having the undermentioned structural formulas:

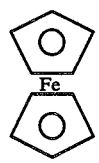 ferrocene

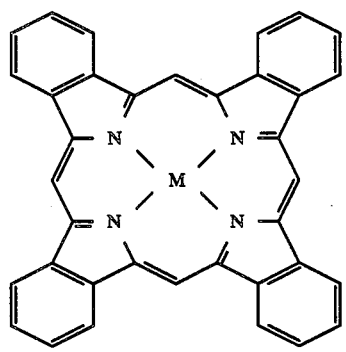 phthalocyanine M(Pc)

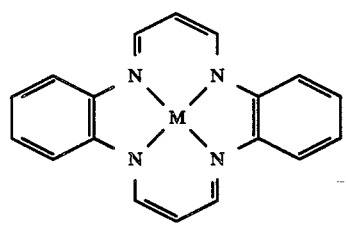 Ni(dbtaa)

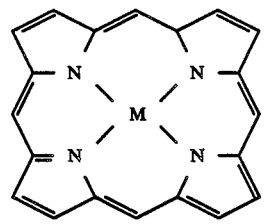 porphyrin

-continued
M(TAAB)
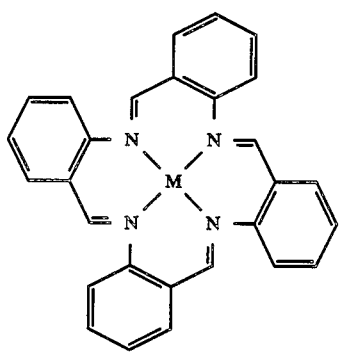
M(bqd)₂
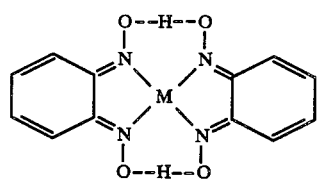
M(dpq)₂
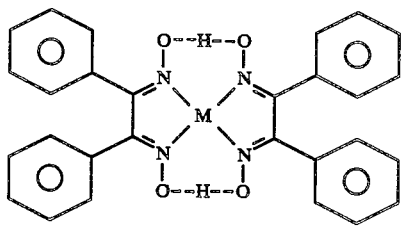
Rh(bpy)₃
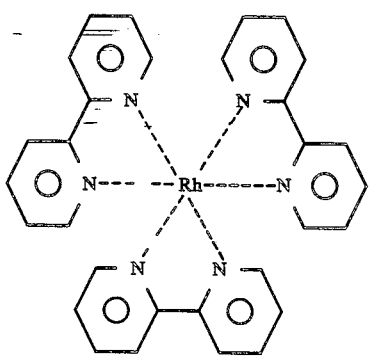
MNT
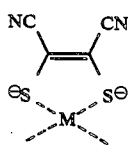
(5) Cyanin coloring matter donor having the undermentioned structural formulas:
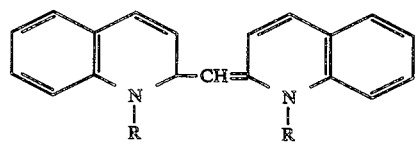
-continued
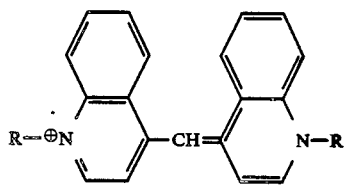
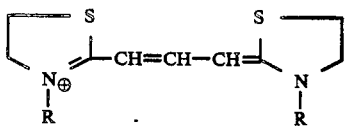
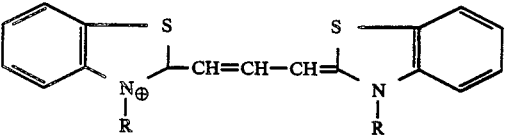
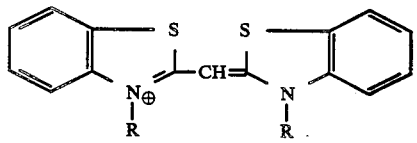
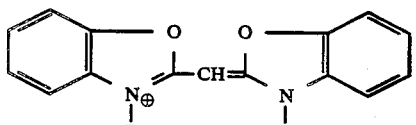
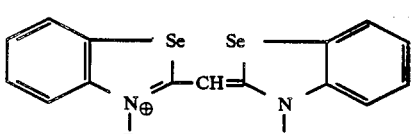
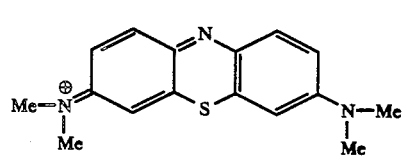
(6) N-containing heterocyclic donor having the undermentioned structural formulas:
phenothiazine
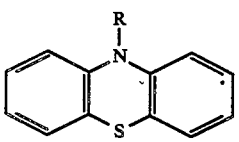
phenazine
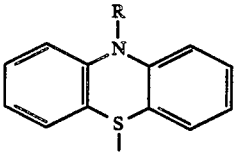
quinoline
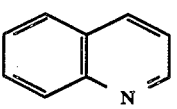

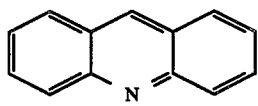 acridine

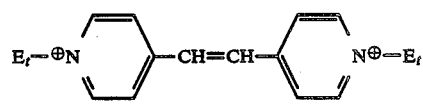 DEPE²⁺

(7) Polymer type donor having the undermentioned structural formulas:

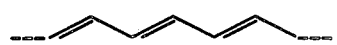 polyacetylene

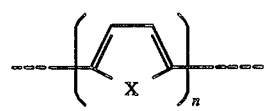 polypyrrole
X = O, N, S

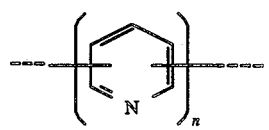 polypyridine

 poly-p-phenylene

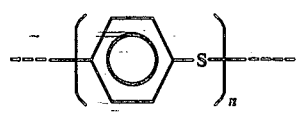 poly-p-phenylenesulfide

The present invention allows for the application of the derivatives of the donor type molecules indicated in items (1) to (7), which have hydrophobic group with a structural formular $CH_3(CH_2)_n$, $CH_3(CH_2)_p(CH_2=CH_2)_q(CH_2)_r$ (where n and p+q+1 respectively represent larger numbers than 8), or hydrophilic group with a structural formular of —COOH, —OH, SO₃H, —COOR', —NH₂, —N⊕(R')₃Y— (Y denotes halogens), or have both said hydrophobic and hydrophilic groups.

Among the aforementioned donor molecules, amine type donors are preferred, but fulvalene type donors and S-containing heterocyclic compound type donors are more preferred.

As used herein, the term "acceptor molecule" is defined to mean an organic molecule which has a great electron affinity ($E_A$), and tends to receive electrons from another molecule and be readily converted into negative ions. The above-defined acceptor molecules include the following:

(1) Cyano compound type acceptors having the undermentioned structural formulas:

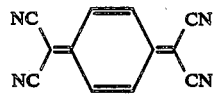 TCNQ

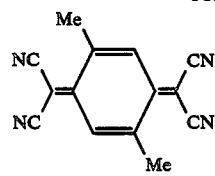 Me₂TCNQ

 TCNDQ

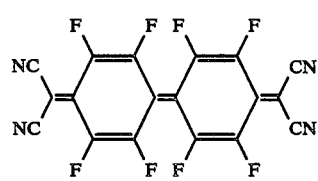

 TNAP

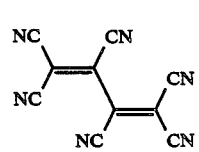 TCNE

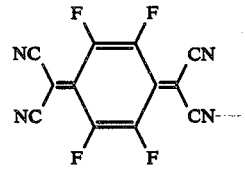 HCB

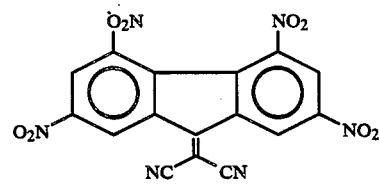

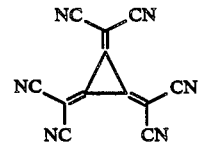

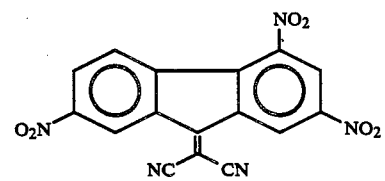 DTF

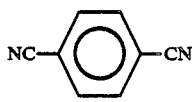 dicyanobenzene DCNB (2) Quinone type acceptor having the undermentioned structural formulas:

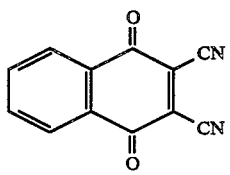 dicyanonaphthoquinone

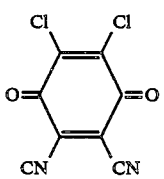 DDQ

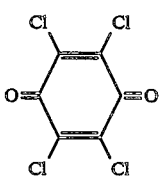 chloranil

 benzoquinone

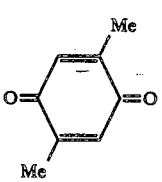 2,5-dimethylbenzoquinone

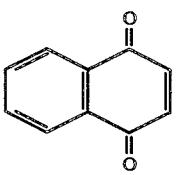 naphthoquinone

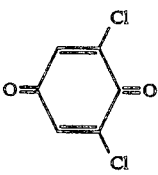 2,6-dichlorobenzoquinone

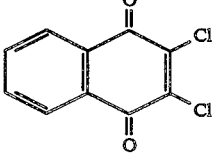 2,3-dichloronaphthoquinone (3) Nitro-compound type acceptor having the undermentioned formulas:

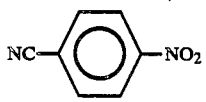 p-nitrocyanobenzene

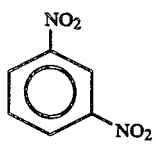 1,3-dinitrobenzene

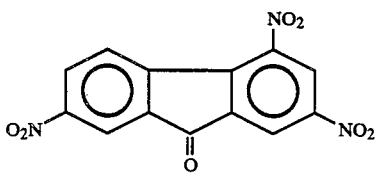 TNF

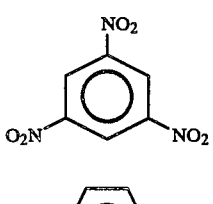 1,3,5-trinitrobenzene

 p-nitrobenzene

The present invention allows for the application of the derivatives of the acceptor type molecules having the structural formulas indicated in items (1) to (3), which have hydrophobic radicals represented by $CH_3(CH_2)_n$―, $CH_3(CH_2)_p(CH_2=CH_2)_q(CH_2)_l$― (where n and a total of $p+q+l$ respectively denote a larger number than 8), or hydrophilic radicals represented by ―COOH, ―OH, ―SO$_3$H, ―COOR′, ―NH$_2$, ―H$^{\oplus}$(R′)$_3$Y$^{-1}$ (Y denotes a halogen), or have both such hydrophobic and hydrophilic radicals.

Among the above-listed acceptor molecules quinone type donors are preferred and cyano compound type donors are more preferred. As used herein, the term "insulating organic molecule" is defined to mean that molecule which does not exchange electrons with respect to other molecules, such as those which have a lower electron affinity and a higher ionization potential than the donor and acceptor molecules. The above-defined insulating organic molecules include the undermentioned types.

(1) Substitutable saturated or unsaturated hydrocarben derivatives which an expressed by the following general structural formula:

R―X where R represents a hydrophobic radical formed of substitutable $CH_3(CH_2)_n$― or $CH_3(CH_2)_p(CH_2=CH_2)_q(CH_2)_l$ (where n and a total of $p+q+l$ respectively represent a larger number than 8), and X represents hydrophilic radicals, including, for example, ―COOH, ―OH, ―SO$_3$H, ―COOR′, ―NH$_2$, ―N$^+$(R′)$_3$Y$^-$ (Y represents a halogen).

(2) Various polymerizable molecules

The subject polymerizable molecules may be represented, for example, by:

polymers of vinyl compound such as substitutable acrylate, methacrylate, vinyl ether, styrene, vinyl alcohol, acrylamide, acryl;

α-amino acids such as alanine, glutamate, aspartate;

amino acids, for example, ε-aminocaprolate other than α-amino acid; and polyamide polymers composed of a 1:1 mixture of diamines such as hexamethylene diamine and carbonic acid such as hexamethylene diamine.

If possessed of a property of being fabricated into a film by themselves, the above-mentioned molecules (2) can be applied in tact. The molecules which can not be fabricated into a film by themselves are applied in the form mixed with the insulating molecules (listed in item (1)) which can be independently formed into a film.

It is preferred that the aforementioned first, second and third films be respectively applied in the form of a monomolecular film fabricated by the Langmuir Blodgett process or in the stacked form.

When a thin organic film display device embodying the present invention is provided with an electrode at both ends, and a bias voltage is impressed on said electrodes, the transfer of electrons or holes takes place between the electronic state of a donor molecule and that of an acceptor molecule. Namely, when the bias voltage exceeds a level expressed as $$\{I_{pD} - E_A) - (e^2/a)\}/e \ [v]$$

where:

$I_{pD}$ = ionization potential of a donor molecule
$E_A$ = electron affinity of an acceptor molecule
$-e^2/a$ = coulomb potential appearing between the holes produced in the donor molecule and those generated in the acceptor molecule then the electronic state of the donor molecule transits to that of the acceptor molecule. As a result of said transition, the donor molecule and acceptor molecule change in valence. At this time a noticeable change appears in the absorption spectrum of the visible section. The display element representing the present invention causes said change in the absorption spectrum to be utilized in a display function.

When the organic film is a laminated body comprising a first organic film containing donor molecules and a second organic film containing acceptor molecules, the transfer of electric charges takes place in an interstice between said first and second organic films. When an organic film formed of a mixture of donor molecules and acceptor molecules is a monomolecular type, the transfer of electric charges occurs between the donor and acceptor molecules involved in a monomolecular film. When the organic film consists of stacked monomolecular film, the transfer of an electric charge takes place between the donor and acceptor molecules contained in a monomolecular film as well as between the donor and acceptor molecules contained in the adjacent monomolecular films.

As described above, a display element embodying the present invention is characterized by the switching operation caused by the transfer of electrons or holes between the organic molecules. To minimize, therefore, variations in the switching voltage, it is necessary to control the thickness of the respective films to the order or Å. Further, the respective films are demanded to have a high uniformity of properties and be as much free from defects as possible. To attain these objects, therefore, it is preferred that the subject organic film be fabricated by the Langmuir-Blodgett process.

The first film containing donor molecules can be prepared, for example, by spreading a liquid containing a mixture of insulating organic molecules and donor molecules on the water for compression and then transferring the compressed mass to the substrate surface or by bonding a hydrophilic or hydrophobic radical with the donor molecules, spreading a solution consisting of said bonded molecules on the water for compression and transferring the compressed mass to the substrate.

The second film containing acceptor molecules can be fabricated by the same process as mentioned above.

The organic thin film display device of the present invention offers the following advantages.

First, since donor and acceptor molecules can be freely selected, it is possible to control the bias voltage for effecting the transfer of electrons or holes namely, switching voltage to a proper level. The light-absorbing property of the subject device accompanied with valency changes varies with the type of the respective molecules. Therefore, it is possible to display any visible blue, green or red color at will.

Secondly, the device of this invention has a different display arrangement from the conventional ECD. Namely, the transfer of electrons or holes has the merit of extremely accelerating a response speed, namely, giving a response in as short a time as about 1 nsec. Since the display operation does not give rise to any change in the molecular structure of the film, any repeated application of the subject display device does not lead to the deterioration of the property. Therefore, said device is enabled to have a long effective life.

In the third place, the subject display device has an super lattice structure attained by repetitively laminating monomolecular organic films, thus realizing a highly efficient operation. Namely, a state transition between the donor molecule and acceptor molecule noticeably arises at the junction. Since the above-mentioned super lattice structure has a large number of such junctions, the total charge transfer amount at a certain bias voltage is tremendously larger than at the junction between the donor molecule layer and acceptor molecule layer constituting, for example, a thick film. Therefore, the organic film display device of this invention has an extremely high light-absorbing efficiency per unit bias voltage.

Description has been made of the case where a single color display is performed with respect to one picture element. However, the present invention is characterized in that since either donor molecule or acceptor molecule is formed of several types, it is possible to display a large number of colors in accordance with the number of combination of the donor and acceptor molecules.

As far as the object of this invention is concerned, it will be sufficient if the subject organic film display device comprises a first donor molecule-containing film laminated with a second acceptor molecule-containing film, and either donor or acceptor molecule is formed of several types. Further, it is possible to let the subject display device have an super lattice structure by repeatedly superposing a plurality of laminated bodies comprised of first donor molecule-containing organic films and second acceptor molecule-containing organic films. Or it is possible to provide a large series of laminated films respectively containing both donor and acceptor molecules, with either donor or acceptor molecule designed to comprise a plurality of types. Further, a laminated body consisting of a first donor molecule-containing film and a second acceptor molecule-containing film may be assembled with another laminated body comprised of a third organic film containing a different type of donor from that of the first film and a fourth organic film containing a different type of acceptor from that of the second film. The organic film can be rendered useful if at least one plane of said film is provided with an organic film containing insulating molecules. Thus, when an organic film in which either donor or acceptor molecule is comprised of a plurality of types like the aforementioned arrangement is used, donor and acceptor molecules jointly realizing the transfer of electrons can be assembled in a plurality of combinations. If molecules are assembled in a different way, a notice charge appears in the level of voltage at which electron transfer takes place. If, in case voltage level is progressively changed, each time electron transfer takes place between the respective assemblies of donor molecules and acceptor molecules, then changes will take place in the light absorbing property of the organic film. If this light absorbing property of the organic film is utilized as a display function, one picture element can display different colors one after another, according as the voltage impressed on said picture element varies in magnitude.

BRIEF DESCRIPTION OF THE DRAWINGS

FIG. 1 illustrates the principle by which the present invention displays a single color;

FIG. 2 shows the principle by which the present invention displays a plurality of colors;

FIG. 3 is a sectional view of a display element according to a first embodiment of this invention, wherein donor molecule films and acceptor molecule films are alternately laminated with an insulating film interposed therebetween;

FIG. 4 is a band pattern illustrating the phenomenon of charge transfer occurring in the display element of FIG. 3;

FIGS. 5 and 6 are sectional views showing the arrangements of organic films used as display elements according to Examples 2 and 3 of the present invention;

FIG. 9 is a sectional view of a multicolor display element according to Example 5 of the invention;

FIG. 10 illustrates the spectral transmittance curves shown by the display element according to Example 5 of the invention;

DETAILED DESCRIPTION OF THE PREFERRED EMBODIMENTS

Figure 7A:
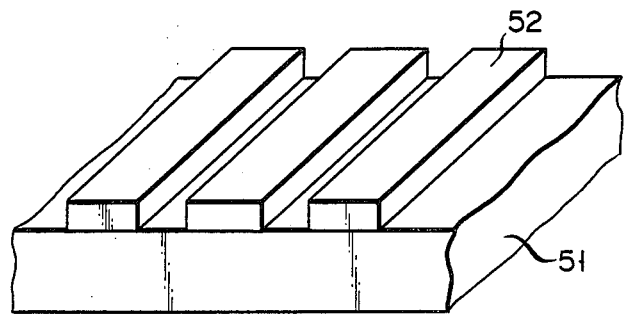
FIGS. 7A and 7B indicate the matrix electrodes of a display element according to Example 4 of the invention.

Description is first made of the phenomenon of charge transfer in the laminate structure consisting of a first organic film containing donor molecules and a second organic film containing acceptor molecules. The operation of the display element of the present invention is fundamentally based on the charge transfer occurring in the laminated body of said first and second films.

FIG. 1 shows an arrangement consisting of first and second films 13, 14 having hetero structures which are interposed between two electrodes 11, 15. A third film 12a containing insulating molecules is interposed between electrode 11 and second film 14. Another third film 12b containing insulating molecules is intervened between electrode 15 and first film 13. Said third films 12a, 12b are provided as barriers for preventing charge transfer between electrode 11 and second film 14 as well as between electrode 15 and first film 13.

According to the display element of the present invention arranged as described above, voltage is impressed across electrodes 11, 15 so as to cause the side of electrode 11 to be rendered positive. When said voltage becomes higher than voltage Vtr indicated by the undermentioned formula:

$$V_{tr} = \frac{l}{a} \cdot \frac{1}{e} \left\{ \left( I_{PD} - E_A - \frac{e^2}{a} \right) \right\} \quad (1)$$

electrons transit from first film 13 t second film 14, thereby causing the donor molecules to have a positive ion (D+) and the acceptor molecules to have a negative ion (A−).

In the above formula, $I_{PD}$ represents the ionized potential of the donor molecule, and $E_A$ denotes the electron affinity of the acceptor molecule. l shows a distance between electrodes 11, 15. a indicates a distance between the hole of the donor molecule and the electron of the acceptor molecule. e denotes a charge elementary quantity.

Molecules absorb light beams to noticeably different extents according as they assume a neutral or ionized state. When electron transfer takes place, for example, from the donor molecule to the acceptor molecule, a tremendous change appears in the light absorption spectrum of the organic film having the structure illustrated in FIG. 1.

Description may now be made of the phenomenon of charge transfer which occurs when a multicolor display is performed when either donor molecule or acceptor molecule is comprised of a plurality of kinds. FIG. 2 represents the case where first film 13 is composed of two different donor molecules $D_1$, $D_2$. Now let it be assumed that the ionized potential of the donor molecule is represented by $I_p(D_1) < I_p(D_2)$, and further that the concentration of the acceptor molecular is equal to the total concentration of two donor molecules. Further, threshold voltages $V_{tr}(1)$ and $V_{tr}(2)$ shown in Formula (1) are assumed to correspond to two assemblies of donor and acceptor molecules $\{D_1, A\}$, $(D_2, A)$. If a voltage impressed across the two electrodes 11, 15, is higher than $V_{tr}(1$, electron transfer arises between $D_1$ and A. If the impressed voltage rises higher than $V_{tr}(2)$, electron transfer appears between $D_2$ and A. The above-mentioned arrangement, therefore, gives rises to three absorption spectrum patterns, namely, one neutral state and two ionized state. When changes in the absorption spectra are utilized as a color display function, it is possible to cause a single picture element to display a plurality of colors.

The present invention will become more apparent by reference to the examples which follow.

EXAMPLE 1

FIG. 3 is a sectional view of the display element according to the first embodiment of the invention. Reference numeral 21 denotes a glass substrate 21. A transparent conductive film 22 is formed on the surface of said substrate 21. 10 to 100 layers of first donor molecule-containing films 23 and second acceptor molecule-containing films 24 are alternately laminated with an insulating organic film 25 interposed between said first and second organic films 23, 24, thereby providing a super lattice structure. These films are fabricated by the Langmurr-Blodgett process. A translucent gold electrode 26 is thermally deposited in vacuum on the top of said super lattice structure with a thickness of 50 nm. Though not shown in FIG. 3, a gold lead having a diameter of 0.3 mm is fitted by means of silver paste of gold electrode 26 and transparent electrode 22 deposited on the substrate. The concrete process of the aforementioned super lattice structure involves the undermentioned steps. 100 μl of a solutions is prepared by dissolving 500 mg of arachic acid ($CH_3$ $(CH_2)18$ COOH) and 300 mg of tetratiafulvalene (TTF) in 100 ml of a solvent prepared by mixing chloroform and acetonitrile in the volumetric ratio of 1:1. Said solution of 100 μl is spread on the surface of an aqueous solution of cadmium chloride of $10^{-4}$ mole/l. A substrate (measuring $20\times30\times2$ mm$^3$) on which transparent conductive layer 22 was formed was degreased and cleaned by applying neutral detergent, trichloroethylene and acetone in the order mentioned. The aforesaid film composed of a mixture of arachic acid and TTF which had been compressed with a surface pressure of 30 dyne/cm was laminated to a 5-ply mass by vertical dipping, thereby providing first organic film 23.

Later, the aforesaid film consisting of a mixture of arachic acid and TTF was completely removed from the water surface by sucking. Then the arachic acid alone was spread on the water surface. Thereafter, one-ply organic insulation layer 23 composed of arachic acid alone was formed by the vertical dipping process. At the time of lamination, the surface of the arachic acid film was subjected to a pressure of 35 dyne/cm.

After the arachic acid was sucked off the water surface, 100 μl of the solution was spread over the water surface which was prepared by dissolving 500 mg of arachic acid and 250 mg of 7,7,8,8-tetracyanoquinodimethane (TCNQ) in 100 ml of a solvent prepared by mixing chloroform and acetonitrile in the volumetric ratio of 1:1. A layer formed of a mixture of arachic acid and TTF was laminated to a 5-ply mass on the laminated mass prepared up to this point by applying a surface pressure of 30 dyne/cm, thereby providing second organic layer 24.

A super lattice structure illustrated in FIG. 3 was fabricated by repeating the above-mentioned step. An aqueous solution of cadmium used in the spreading step taken in the formation of all the aforesaid Langmuir Blodgett films was held at a temperature of $18\pm0.1°$ C. A substrate bearing the super lattice structure prepared from said LB films was left for 5 hours in a dry box containing a desiccating agent of silica gel for sufficient drying. Thereafter gold electrode 26 was deposited on said dry laminated mass.

FIG. 4 is a typical band pattern of the surface lattice structure of a display element fabricated in the aforementioned manner. first organic film 23 containing TTF as donor molecules has a low ionization potential $I_{PD}$. Second organic film 24 containing TCNQ as acceptor molecules has such electron affinity $E_A$ as is slightly lower than the ionization potential $I_{PD}$ of the first organic film. Insulative organic film 25 has a sufficiently smaller electron affinity and yet a fully higher ionization potential than first and second organic films 23, 24. When, therefore, bias voltage is so impressed as to render first organic film 23 negative, then the transition of electrons takes place from first organic film 23 to second organic film 24 as indicated by a broken line arrow in FIG. 4. As a result, the light absorbing property of the super lattice structure is changed to ensure a display function.

Description may now be made of a concrete display function. Power source was so connected as to render the transparent conductive film 22 of FIG. 3 negative, and gold electrode 26 thereof positive. Light beams of an incandescent lamp were projected from the side of gold electrode 26. When no voltage was impressed, the display element indicated a yellow color. When 15 volts were impressed, the color changed to green. Measurement was made of the response speed at which colors varied with the magnitude of the impressed voltage. It was disclosed that the indication and extinction of a green light followed voltage charges with a delay of 1 ms. $10^5$ times of color display operations give rise to no change in the color displaying property of the subject color displaying element.

A color display element was manufactured under the substantially same conditions as in the foregoing embodiment, except that TTF was replaced by tetrathiatetracene (TTT). When 12 volts were impressed, this display element has its yellow color changed to a green color. The response speed at which the color varied with the voltage was 1.2 ms. $10^5$ times of color display operations did not cause the display element to make any change in property.

EXAMPLE 2

FIG. 5 sets forth the case where a series of first and second films 33, 34 were laminated with no insulation film interposed therebetween. This structure indicated the same property as Example 1.

EXAMPLE 3

FIG. 6 shows the case where laminated bodies of first and second films 43, 44 were stacked one upon another with an insulating film interposed therebetween. This structure also realized the same property as Example 1.

EXAMPLE 4

This example represents a concrete display element containing a matrix electrode. As seen from FIG. 7A, ITO film stripes 52 were deposited on quartz glass substrate 51 at an interval of about 100 microns and with a width of 500 microns. As indicated in FIG. 5, first donor molecule-containing film 33 and second acceptor molecule-containing film 34 were alternately laminated ten times. In this case, first donor molecule film 33 consisted of a monomolecular LB film prepared by introducing an alkyl group in TTF. Second acceptor molecule film 34 was prepared from a monomolecular LB film prepared by introducing an alkyl group in TCNQ.

Figure 7B:
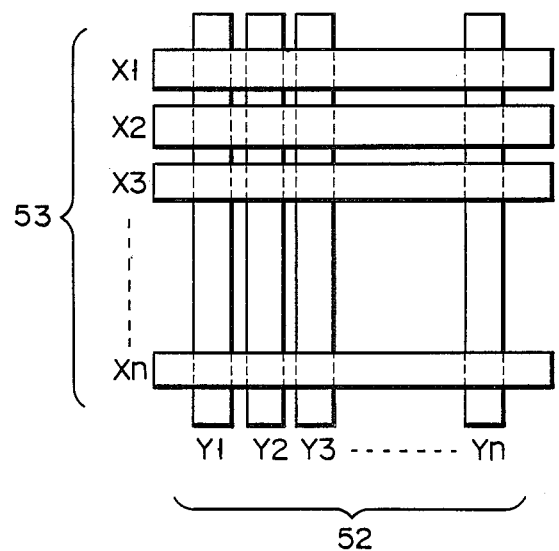

Further as shown in FIG. 7B, Al stripe films 53 were deposited at an interval of about 100 microns and with a width of about 500 microns, in such a manner that said Al stripe films 53 extended in the perpendicular direction as well as in the same direction as that in which ITO films 52 were deposited. In this case, Al films 53 with a thickness of 200 Å were formed by vacuum evaporation by means of a metal mask. A region (500 microns×500 microns) defined by the overlapping of ITO film 52 on Al film 53 constitutes one picture element. In this case, ITO film 52 corresponds to a signal electrode, and Al film 53 corresponds to a scanning electrode.

In this case the following data were obtained:

| | |
|---|---|
| The threshold voltage Vth required for electron transition from the donor molecule to the acceptor molecule | 10 V |
| A length of time $t_{th}$ required for the commencement of electron transfer under the condition in which Vth + ΔV (ΔV>0) was impressed | 1 microsecond |
| A length of time tm required for the ionic condition ($D^+A^-$) in which electron transfer took place to regain the original nutral state ($D_oA_o$) with the 0 voltage impressed | 40 milliseconds |

In the display element embodying the present invention, the number of picture elements was set at 10,000, and the picture area was defined to have a size of 6 cm×6 cm.

Description may now be made of the operation of the above-described display element.

Figure 8A:
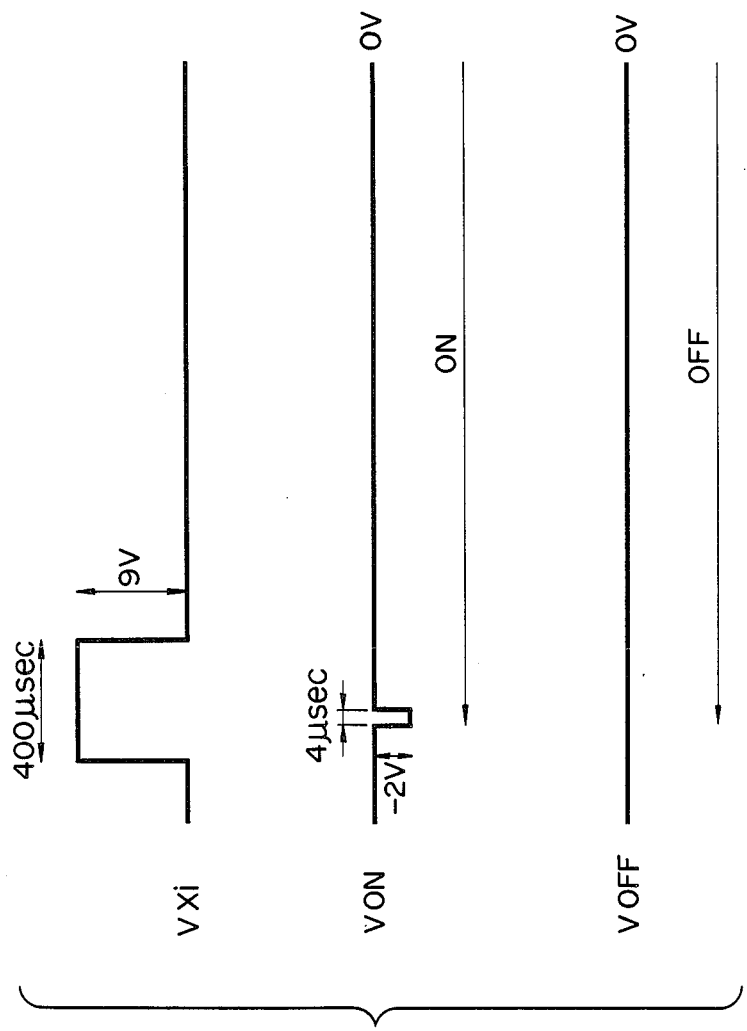
FIGS. 8A and 8B are timing charts indicating the operation of the display element according to Example 4 of the invention.

FIG. 8A is a chart illustrating the principle on which the start and stop of the display operation of one picture element (Xi; Yj).

Now let it be assumed that pulse voltage $V_{Xi}$(=9 V) is impressed on scanning electrode Xi for a length of time tx (=400 micronseconds). During said period tx, signal voltage $V_{Yj}$ is successively impressed on signal electrode Yj for a length of time ty (=4 microseconds). In this case, a picture element desired to display a color has its signal electrode impressed with pulse voltage $V_{ON}$(=−2.0 V). A picture element required to cease a color display has its signal electrode impressed with voltage $V_{OFF}$ (=0.0 V). Namely, when the picture element (Xi; Yj) is rendered on, the following steps are taken:

$V_{Xi} = V_X = 9.0$ V $V_{Yj} = V_{ON} = -2.0$ V

Therefore, $V_{Xi} - V_{Yd} = 11.0$ V>Vth=10.0 V

When the picture element is rendered off, the following step an take:

$V_{Xi} = V_X = 9.0$ V $V_{Yj} = V_{OFF} = 0.0$ V

Therefore $V_{Xi} - V_{Yd} = 9.0$ V<Vth=10.0 V

Once rendered on, a picture element sustains display during a period of time tm (=40 milliseconds).

Figure 8B:
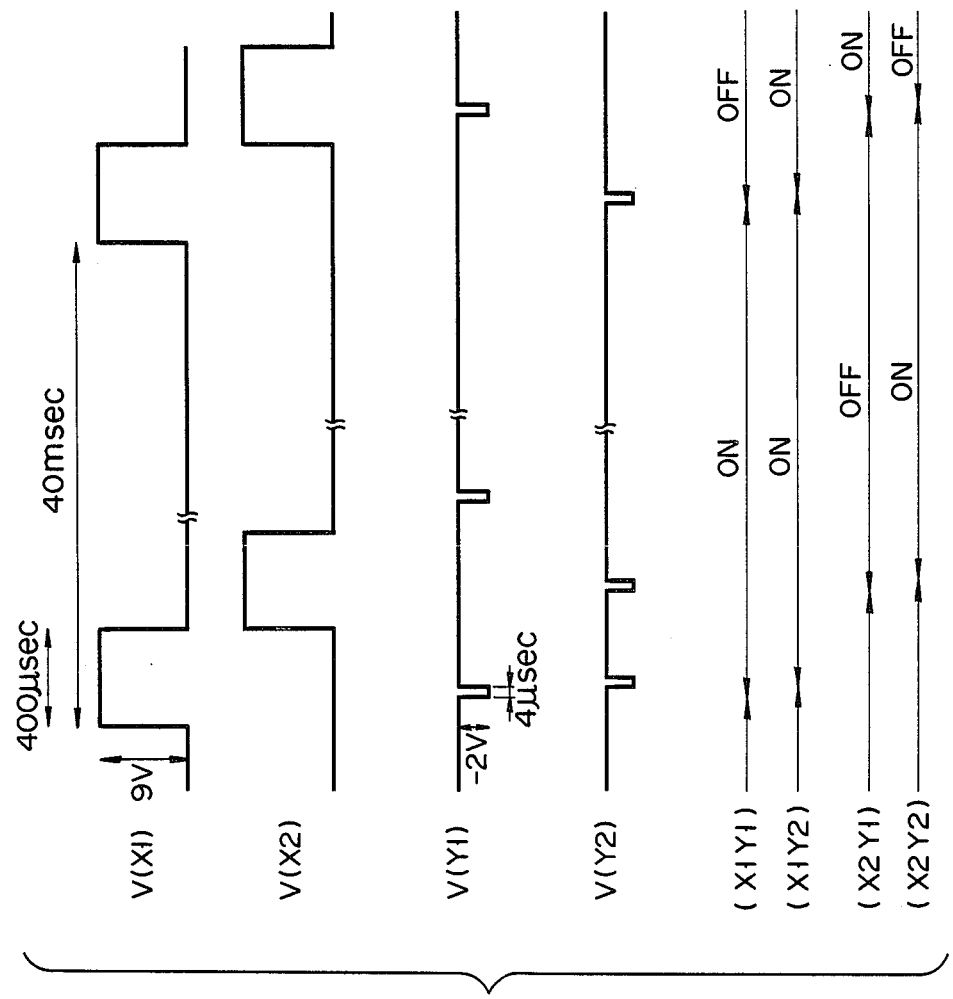

FIG. 8B represents the driving signal timing chart of a matrix display. The scanning electrodes $X_1, X_2 \ldots X_n$ are successively impressed with a pulse voltage of 9 V having a width of 400 microseconds. Since 100 scanning electrodes are provided, pulse voltage is impressed with a period of 40 milliseconds. Signal electrodes $Y_1, Y_2 \ldots Y_m$ are impressed with signal pulse voltage having a width of 4 microseconds with a period of 400 microseconds. When the signal pulse voltage stands at −2 V, the corresponding element is rendered conducting for display. When the signal pulse voltage indicates 0 V, the corresponding picture element is rendered off. FIG. 8 indicates the on and off states of the respective picture elements.

EXAMPLE 5

FIG. 9 illustrates the construction of a multicolor display element embodying the present invention. Reference numeral 61 represents a glass substrate. Deposited on this substrate is a transparent conductive film 62 prepared from, for example, ITO. Further, insulative molecule film 64a is deposited o said conductive film 62 with inorganic insulative film 63 interposed therebetween. Formed on said laminated assembly is a surfer lattice structure constructed by alternately laminating acceptor molecule-containing film 66 and donor molecule-containing film 65 which comprises two different donor molecules $D_1$, $D_2$.

Inorganic insulative film 63 was formed by depositing $SiO_2$ film by the CVD process with a thickness of 2000 Å. Insulative molecule-containing films 64a, 64b, acceptor molecule-containing film 66 and donor molecule-containing film 65 were prepared by the Langmuir blodgett process. To described concretely, acceptor molecule-containing film 66 was fabricated by providing an alkyl chain derivative of tetracyanoquinodimethane (TCNQ) as an acceptor molecule, mixing said derivative with stearic acid in the molecular ratio of 1:1 and laminated two resultant monomolecular LB films. Donor molecule-containing film 65 was formed by providing an alkyl chain derivative of tetrathiafulvalene (TTF) and an alkyl chain derivative of paraphenylene diamine (PD) as donor molecules, mixing said two alkyl chain derivatives with stearic acid in the molar ratio of 1:1:2 (2 represents the content of stearic acid), and laminated the two resultant monomolecular LB films. Insulative molecule-containing films 64a, 64b were formed by laminating five stearic LB films. Top electrode 67 was fabricated by the evaporation of aluminium with a thickness of 100 Å.

When said top electrode 67 is impressed with such voltage as to be rendered positive, then a white transmitted spectrum changes as mentioned below in accordance with the level of said voltage. FIG. 10 indicates said spectrum changes. Notation ① indicates a pattern of a transmitted spectrum appearing when no voltage is impressed. When the impressed voltage rises higher than $V_{tr}(1)=1.5$ V, the transmitted spectrum shows a pattern represented by notation ②. Further when the impressed voltage exceeds $V_{tr}(2)$ 2.5 V, the transmitted spectrum presents a pattern marked by notation ③. Accordingly, a color to be displayed can be changed in 3 steps in accordance with the level of the impressed voltage as illustrated below:

| | |
|---|---|
| In case of $V < V_{tr}(1)$ | yellow |
| In case of $V_{tr}(1) < V < V_{tr}(2)$ | blue |
| In case of $V_{tr}(2) < V$ | red |

In the above-mentioned display element representing the present invention, the organic films can be laminated in any optional number of plies. Further, the thickness of the insulative film 63 may have any optional thickness. Proper selection of the number of the laminated films and the thickness of the respective films ensures the identical property of the basic display element, though minor changes appear in threshold voltage $V_{tr}(1)$, $V_{tr}(2)$.

EXAMPLE 6

Figure 11:
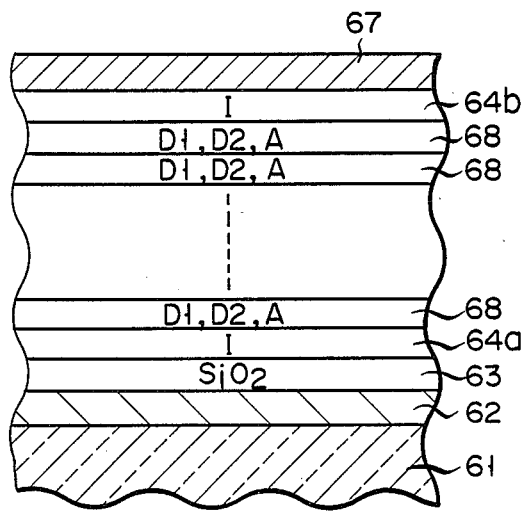
FIGS. 11 and 12 are sectional views of the multicolor display elements according to Examples 6 and 7 of the invention.

This example is represented by another type of multicolor display element illustrated in FIG. 11.

The multicolor display element of FIG. 11 has a different arrangement from that of FIG. 9 is the undermentioned respect. Namely, the organic film has a hetero structure represented by film 68 consisting of two donor molecules $D_1$, $D_2$ and one acceptor molecule A. Said film mixture is represented by an LB film which is prepared by mixing an alkyl chain derivative of TTF acting as a donor molecule, alkyl chain derivative of PD, alkyl chain derivative of TCNQ acting as an acceptor molecule and stearic acid acting as an insulating molecule in the molar ratio 1:1:2:2. According to the present invention, the laminated film body 8 is defined to consist of, for example, 14 plies.

Example 6 ensures the manufacture of a color display element capable of indicating a large number of colors like the preceding Example 5.

EXAMPLE 7

Figure 12:
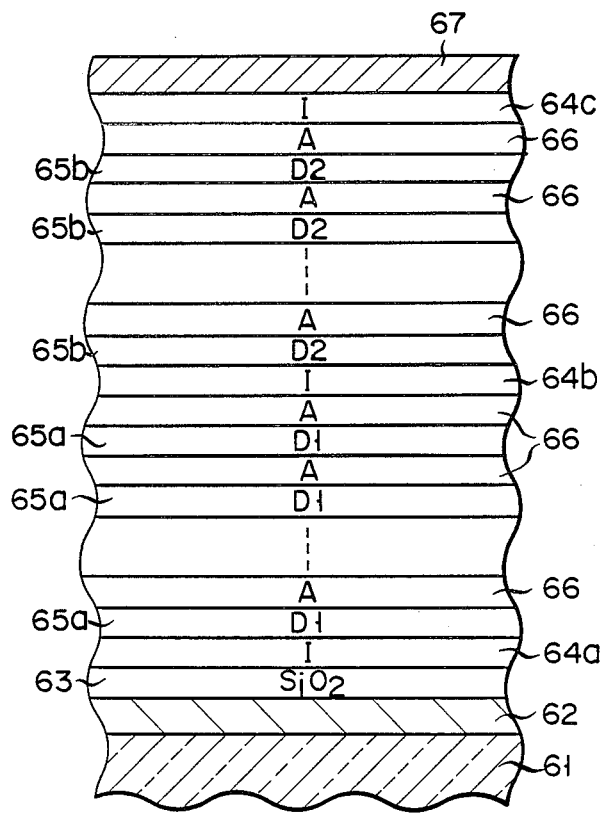

This example refers to still another type of multicolor display element (FIG. 12). Example 7 represents two hetero super lattice structures. This assembled body is composed of one super lattice structures prepared by laminating a large number of hetero structure respectively consisting of donor molecule films 65a containing donor molecule $D_1$ and acceptor molecule films 66 and another super lattice structure constructed by laminating a large number of hetero layer structures composed of donor molecule film 65b containing donor molecule $D_2$ and acceptor molecule film 66. In Example 7, one donor molecule film 65a consists of an LB film prepared by film 65a consists of an LB film prepared by mixing TTF with stearic acid is the molar ratio of 1:1. Another donor molecule film 65b consists of an LB film obtained by mixing PD and stearic acid in the molar ratio of 1:1. Example 7 of FIG. 12 indicates the same satisfactory properties as those of the preceding examples.

In the foregoing Examples 5 to 7, two kinds of donor molecules and one kind of acceptor molecule were assembled together. However more kinds of donor and acceptor molecules may be assembled, thereby ensuring the display of more than three colors. Further, various kinds of organic films described in Examples 5–7 may be properly assembled.

In Examples 5–7, inorganic insulative film 63 may be omitted. Similarly, insulative molecule-containing films 64a, 64b and 64c may be omitted, in case it is possible to build a barrier sufficiently effective to obstruct the electric charge transfer between an organic film and electrode 67 or transparent conductive film 62 deposited on the substrate by selection of proper materials. However, insulative molecule-containing films 64a, 64b and 64c are indispensable in order to ensure more effective charge transfer by reliably preventing carries from being taken into an organic film from an electrode or substrate. Further as viewed from the stability of the properties of elements, it is required to provide the insulative molecule-containing films 64a, 64b and 64c particularly the insulative molecule-containing film 64b, 64c positioned underneath electrode 67. The reason is as follows. Generally, a method electrode indicates by itself a strong acceptor or donor characteristic, and also is possessed of high diffusivity. If, therefore the metal electrode is brought into direct contact with a donor molecule-containing film or acceptor molecule-containing film, then a complex compound tends to be readily produced, probably resulting in the deterioration of the property of display element.

Throughout the fore going examples 5–7, TTF and PD were cited as donor molecules, TCNQ as an acceptor molecule and stearic acid as an insulative molecule. Since, however, a light-absorbing property varies with the kind of an organic molecule, the subject display element can indicate diversified colors by properly selecting the kind of molecules to the applied.

EXAMPLE 8

This example shows a concrete display element having a matrix electrode. The element had the heterostructure shown in FIG. 12. Its matrix electrode was identical with that illustrated in FIGS. 7A and 7B. Its film $D_1$ was a monomolecular LB film of an alkyl chain derivative of TTF. Its film $D_2$ was a monomolecular LB film of PD. Its film A was a monomolecular film of an alkyl chain derivative of TCNQ. The element was comprised of ten units each consisting of film $D_1$ and film A, and ten units each consisting of film $D_2$ and film A.

The display element emitted yellow light when a voltage of less than 16 V was applied to it. It turned blue when a voltage ranging from 16 V to 20 V was applied to it. It glowed red when a voltage of more than 20 V was applied to it. About 1 microsecond had passed until the element displayed these colors after the application of the voltage. Molecules $D_1{}^+A^-$ and $D_2{}^+A^-$ required about 40 milliseconds to become electrically neutral after the application of voltage had been stopped.

Figure 13A:
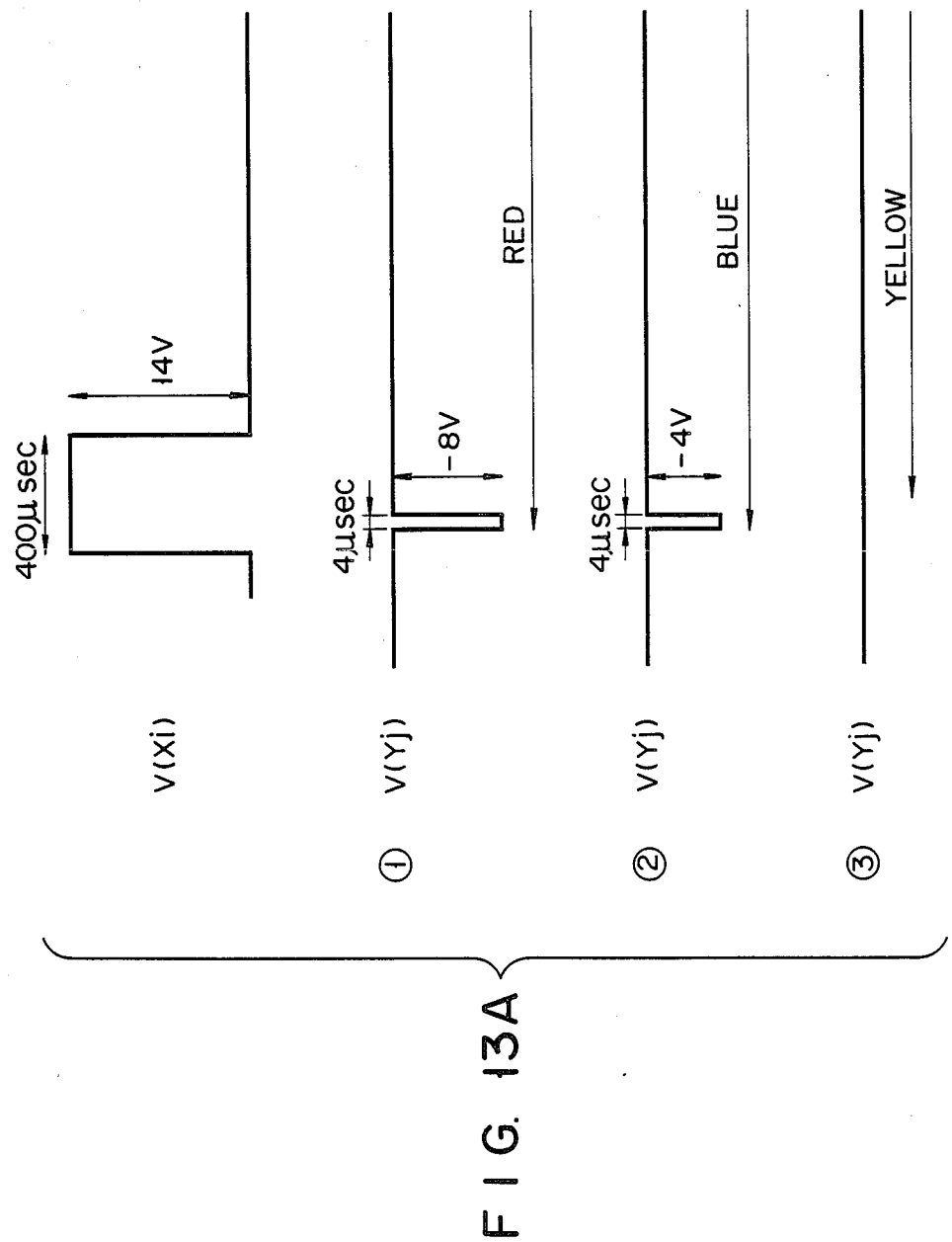
FIGS. 13A and 13B are timing charts illustrating the operation of the multicolor display element according to Example 8 of the invention.

The operation of the one-picture elements forming the display element of Example 8 will be explained with reference to FIG. 13A. The one-picture element consisting of a scanning electrode Xi and a signal electrode Yj glows red when $-8$ V is applied to electrode Yj while $+14$ V is being applied to electrode Xj. This one-picture element turns blue when $-4$ V is applied to signal electrode Yj in the same condition. The one-picture element turns yellow when 0 V is applied to signal electrode Yj in the same condition. Each of these display condition stays unchanged for approximately 40 milliseconds after the application of the voltage to electrode Yj.

Figure 13B:
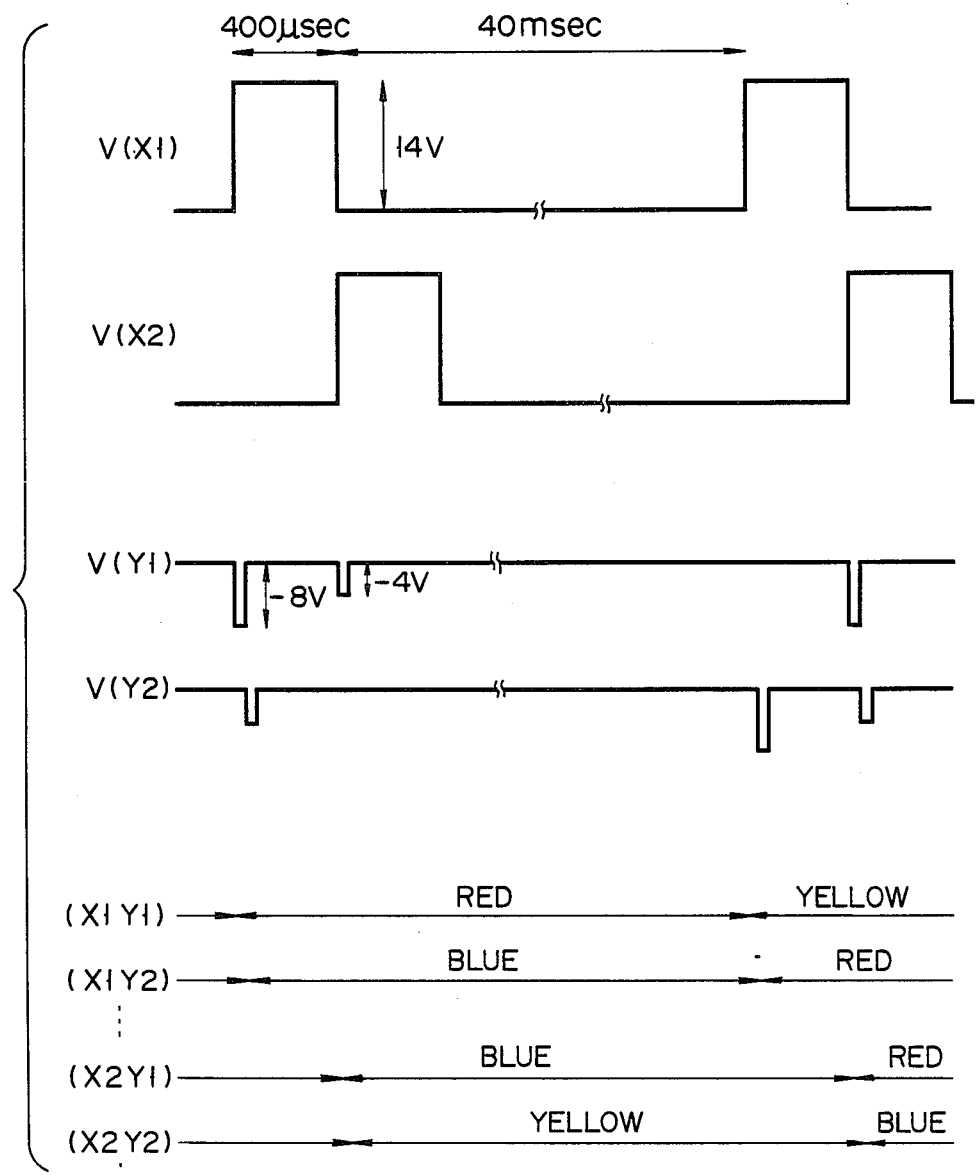

FIG. 13B is a timing chart showing when driving signals are supplied to the matrix display element of Example 8. The timing of supplying the driving signals is the same as in the mono-color display of Example 4, but Example 8 is different from Example 4 in that signal pulse voltages of 0 V, $-4$ V and $-8$ V are applied to the one-picture elements, thereby causing the one-picture elements to emit yellow light, blue light and red light, respectively.

What is claimed is:

1. A thin organic film display element, comprising:
    a thin organic film layer including at least one first thin organic film containing donor molecules and at least one second thin organic film containing acceptor molecules, wherein said thin organic film layer has at least two interfaces between said first thin organic film and said second thin organic film; and
    means for causing a charge transfer between the donor molecules and the acceptor molecules, said charge transfer varying the optical characteristics of the thin organic film layer, whereby the organic thin film layer displays an image.

2. The display element of claim 1, wherein said thin organic film layer comprises a plurality of repeatedly stacked layers comprising said first thin organic film and said second thin organic film.

3. The display element of claim 2, wherein a third thin organic film containing electrically insulating organic molecules is interposed between said first thin organic film and said second thin organic film.

4. The display element of claim 2, wherein each of said stacked layers comprises said first thin organic film and said second thin organic film, and a third thin organic film containing electrically insulating organic molecules interposed between said stacked layers.

5. The display element of claim 1, wherein at least one of said first thin organic film and said second thin organic film contains electrically insulating organic molecules.

6. The display element of claim 1, wherein said thin organic film layer has a super lattice structure.

7. The display element of claim 1, wherein said thin organic film layer contains at least one of different donor molecules or different acceptor molecules.

8. The display element of claim 1, wherein said first thin organic film contains different donor molecules.

9. The display element of claim 1, wherein said second thin organic film contains different acceptor molecules.

10. The display element of claim 1, wherein said first thin organic film contains different donor molecules, and said second thin organic film contains different acceptor molecules.

11. The display element of claim 1, wherein a thin film containing electrically insulating organic molecules is formed on at least one surface of said thin organic film layer.

12. The display element of claim 1, wherein said thin organic film layer is a laminate consisting of LB films.

13. The display element of claim 1, wherein a stripe-like scanning electrode is formed on one side of the opposing surfaces of said thin organic film layer, a stripe-like signal electrode is formed on the other opposing surface of said thin organic film layer and extends at right angles to the stripe-like scanning electrode, and said means for causing a charge transfer is connected to the scanning electrode and signal electrode for selectively applying a pulse voltage to said thin organic film layer.

14. A thin organic film display element, comprising:
a thin organic film layer which comprises at least one thin organic film containing both donor molecules and acceptor molecules; and
means for causing a charge transfer between the donor molecules and the acceptor molecules, said charge transfer varying the optical characteristic of the thin organic film, whereby the thin organic film displays an image;
wherein a thin film containing electrically insulating organic molecules is formed on at least one surface of said thin organic film layer.

15. The display element of claim 14, wherein said thin organic film contains at least one of different donor molecules or different acceptor molecules.

16. The display element of claim 14, wherein said thin organic film layer comprises a plurality of thin organic films each containing donor molecules and acceptor molecules.

17. The display element of claim 14, wherein each of said thin organic films contains at least one of different donor molecules or different acceptor molecules.

18. The display element of claim 14, wherein said thin organic film is an LB film.

19. A thin organic film display element, comprising:
a thin organic film layer which comprises at least one thin organic film containing both donor molecules and acceptor molecules; and
means for causing a charge transfer between the donor molecules and the acceptor molecules, said charge transfer varying the optical characteristics of the thin organic film, whereby the thin organic film displays an image;
wherein a stripe-like scanning electrode is formed on one of the opposing surfaces of said thin organic film layer, a stripe-like signal electrode is formed on the other opposing surface of said thin organic film layer and extends at right angles to the stripe-like scanning electrode, and said means for causing a charge transfer is connected to the scanning electrode and signal electrode for selectively applying a pulse voltage to said thin organic film layer.

* * * * *